United States Patent
Kuhn

(10) Patent No.: US 6,617,883 B1
(45) Date of Patent: Sep. 9, 2003

(54) DUAL DIFFERENTIAL INPUT COMPARATORS WITH INTEGRATED PHASE DETECTOR

(75) Inventor: Jay A. Kuhn, Seattle, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/106,701

(22) Filed: Mar. 26, 2002

(51) Int. Cl.[7] .................. G01R 25/00; H03D 13/00

(52) U.S. Cl. .................. 327/3; 327/12; 327/67

(58) Field of Search .................. 327/1, 2, 3, 5, 327/12, 65, 67, 71, 52, 54, 55, 57, 309, 321, 323, 327, 328

(56) References Cited

U.S. PATENT DOCUMENTS 5,691,656 A * 11/1997 Sandusky .................. 327/7

OTHER PUBLICATIONS

Pickering, US Patent Application Publication 2002/0, 125, 960.*

Sedra et al., "Microelectronic Circuits," CBS College Publishing, second edition, pp. 867–878.*

Kuhn, Jay A., "Circuit for Correction of Differential Signal Path Delays in a PLL", U.S. Ser. No. 09/846,146, filed Apr. 30, 2001.

Kuhn, Jay A., "Master/Dual–Slave D Type Flip–Flop", U.S. Ser. No. 09/844,785, filed Apr. 27, 2001.

* cited by examiner

Primary Examiner—Toan Tran
(74) Attorney, Agent, or Firm—Christopher P. Maiorana, P.C.

(57) ABSTRACT

An apparatus comprising a first circuit and a second circuit. The first circuit may be configured to generate (i) a first intermediate signal in response to a first differential signal and (ii) a second intermediate signal in response to a second differential signal. The second circuit may be configured (i) to generate one or more output signals in response to a relative arrival time of the first and second intermediate signals and (ii) to clamp a later arriving one of the first and second intermediate signals to a predefined voltage level.

20 Claims, 7 Drawing Sheets

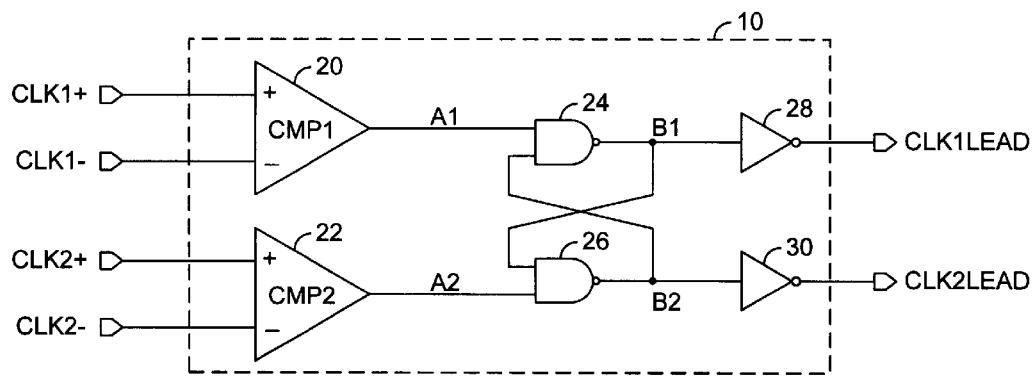
(CONVENTIONAL)
FIG. 1

DUAL DIFFERENTIAL INPUT COMPARATORS WITH INTEGRATED PHASE DETECTOR

FIELD OF THE INVENTION

The present invention relates to a method and/or architecture for phase detection generally and, more particularly, to a method and/or architecture for dual differential input comparators with an integrated phase detector.

BACKGROUND OF THE INVENTION

Certain applications use an output signal that indicates as accurately as possible which of two differential signals arrives first. The arrival of the signal can be determined by a rising edge of the signal. The rising edge of a differential signal can be defined as the time when the positive differential input rises to an amplitude more positive than the negative differential input. In general, the determination of arrival time is referred to as phase detection with the earlier signal said to be ahead or leading in phase. A digital or binary phase detector indicates only which signal is ahead and does not quantify the amount by which one signal leads the other signal.

Referring to FIG. 1, a block diagram of a conventional phase detector 10 is shown. The phase detector 10 includes a comparator 20, a comparator 22, a NAND gate 24, a NAND gate 26, and inverting buffers 28 and 30. The comparator 20 receives a differential signal CLK1 (i.e., the signals CLK1+ and CLK1−). The comparator 22 receives a differential signal CLK2 (i.e., the signals CLK2+ and CLK2−). The comparators 20 and 22 amplify the differential signals CLK1 and CLK2 to generate full swing logic level outputs A1 and A2, respectively. For example, the differential signals CLK1 and CLK2 can be positive emitter coupled logic (PECL) signals that swing +/−250 mV around 2.0V. The 500 mV voltage swing of the signals CLK1 and CLK2 is amplified to a 0-VDD CMOS logic level by the comparators 20 and 22. The technique can be applied to other signal levels and even single ended signals where the negative inputs of the comparators 20 and 22 (i.e., CLK1− and CLK2−) are connected to a DC reference voltage. The differential signals CLK1 and CLK2 can have levels that swing from rail to rail.

An input rising edge of the differential signal CLK1 is defined when the signal CLK1+ rises to a more positive potential than the signal CLK1−. After some delay, the output A1 of the comparator 20 rises from 0 to VDD. The output A2 of the comparator 22 responds similarly when the signal CLK2+ rises to a more positive potential than the signal CLK2 −.

The NAND gates 24 and 26 perform the phase comparison operation on the full swing logic signals A1 and A2. While A1 and A2 are below a logic threshold of the gates 24 and 26 (e.g.; a logic LOW), outputs B1 and B2 of the gates 24 and 26, respectively, are HIGH (e.g., a logic "1") and signals CLK1LEAD and CLK2LEAD are both LOW (e.g., a logic "0"). When the signal A1 rises before the signal A2, the output of the gate 24 (i.e., the signal B1) transitions LOW when the signal A1 reaches the logic threshold of the gate 24. The threshold of the gate 24 is typically VDD/2. When the signal B1 becomes LOW, the signal B2 is forced to remain LOW even after the signal A2 rises. The signal CLK1LEAD transitions HIGH and the signal CLK2LEAD remains LOW. The signal CLK1LEAD can be sampled by other digital circuitry and processed.

A disadvantage of the circuit 10 is that the differential signals CLK1 and CLK2 are amplified to full swing logic levels in order for the cross coupled gates 24 and 26 to make a decision on which signal arrived first. In addition, each of the comparators 20 and 22 can add a delay that is proportional to the following factors: the amplitude of the respective differential input signal; the slew rate of the respective differential input signal; and the load capacitance the comparator must drive. The sensitivity of the comparator delays to input signal amplitude and slew rate can increase (i) the more the signal is amplified and (ii) the greater the load capacitance the comparator must drive.

Referring to FIG. 2, a timing diagram illustrating various signals of FIG. 1 is shown. A timing error "ΔTERR" can be defined as the input arrival time difference between the signals CLK1 and CLK2 that results in the two signals A1 and A2 arriving simultaneously at the inputs of the cross coupled gates 24 and 26 (e.g., the point 32). The signals CLK1LEAD and CLK2LEAD each have a 50% chance of transitioning HIGH or LOW. When the slew rate of the signal CLK1 is lower than the slew rate of the signal CLK2, the amplified output of the comparator 20 can rise more slowly than the output of the comparator 22. When the output of the comparator 20 rises more slowly than the output of the comparator 22. The signal CLK1 must arrive earlier than the signal CLK2 for the signals A1 and A2 to arrive at the comparison gates 24 and 26 at the same time. The arrival time difference is the timing error ΔTERR.

The timing error ΔTERR can be minimized by minimizing the switching range of the inputs of the comparators 20 and 22 (i.e., making the DC gain of the comparators as large as possible). High DC gain can be obtained with high transconductance (GM) transistors in the front end of the comparators 20 and 22. High GM CMOs transistors are physically large and run at small current density. Large input transistors and small current density have disadvantages including: (i) larger parasitic gate to drain and gate to source capacitance; (ii) larger input capacitance; (iii) greater power consumption; and (iv) greater layout area requirement.

The above factors can impose practical limitations on the gain of the comparators 20 and 22. The input capacitance of the comparators 20 and 22 can become large. The physical area used for the comparators 20 and 22 can become large. The speed of the circuit 10 can decrease due to increases in parasitic loading. For example, larger parasitic capacitance can cause parasitic signal paths (e.g., gate-drain and gate-source capacitance) that add another mechanism for the delay of the comparators 20 and 22 to change with input signal slew rate and amplitude.

SUMMARY OF THE INVENTION

The present invention concerns an apparatus comprising a first circuit and a second circuit. The first circuit may be configured to generate a first intermediate signal in response to a first differential signal and to generate a second intermediate signal in response to a second differential signal. The second circuit may be configured (i) to generate one or more output signals in response to a relative arrival time of the first and second intermediate signals and (ii) to clamp a later arriving one of the first and second intermediate signals to a predefined voltage level.

The objects, features and advantages of the present invention include providing dual differential input comparators with an integrated phase detector that may (i) accurately detect which of two signals arrives first; (ii) minimize timing error in detecting which signal arrives first when the two signals have different rise times (slew rates) and or amplitudes; (iii) minimize timing error in detecting which signal arrives first by minimizing the voltage swing required of an input amplifier; (iv) comprise a pair of cross-couple transistors; (v) be integrated with a differential amplifier; (vi) replace the functionality of a pair of cross-coupled logic gates; (vii) make the decision of which signal arrives first at a very small voltage change; and/or (viii) present a minimum load to the comparators maximizing their speed.

BRIEF DESCRIPTION OF THE DRAWINGS

These and other objects, features and advantages of the present invention will be apparent from the following detailed description and the appended claims and drawings in which:

FIG. 1 is a detailed block diagram of a conventional digital phase detector circuit;

DETAILED DESCRIPTION OF THE PREFERRED EMBODIMENTS

Figure 3:
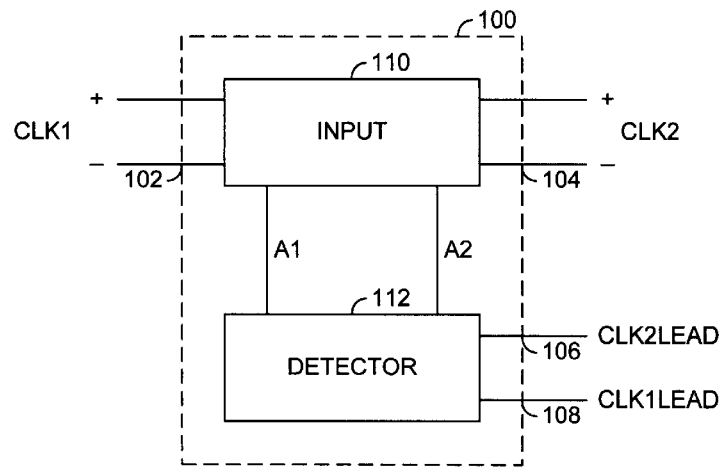
FIG. 3 is a block diagram of a preferred embodiment of the present invention.

Referring to FIG. 3, a block diagram of a circuit 100 is shown in accordance with a preferred embodiment of the present invention. The circuit 100 may be configured to receive a first differential signal (e.g., the signals CLK1+ and CLK1−, hereinafter referred to as the signal CLK1) and a second differential signal (e.g., the signals CLK2+ and CLK2−, hereinafter referred to as the signal CLK2). The circuit 100 is generally configured to and generate one or more output signals (e.g., CLK1LEAD and CLK2LEAD). The circuit 100 may have an input 102 that may receive the differential signal CLK1, an input 104 that may receive the differential signal CLK2, an output 106 that may present the signal CLK2LEAD and an output 108 that may present the signal CLK1LEAD. In general, the circuit 100 may be implemented as a "digital" or "binary" phase detector. The circuit 100 generally indicates which of the signals CLK1 and CLK2 is ahead (leading) in phase. The circuit 100 may be configured to (i) assert the signal CLK1LEAD when the signal CLK1 arrives before the signal CLK2 and (ii) assert the signal CLK2LEAD when the signal CLK2 arrives before the signal CLK1.

The signals CLK1LEAD and CLK2LEAD may indicate which of the two differential signals CLK1 and CLK2 arrives first. In one example, the "arrival" of the signals CLK1 and CLK2 may be determined by a rising edge of the signals CLK1 and CLK2. The term rising edge as used herein is generally defined as the point at which a positive differential input (e.g., the signal CLK1+ or the signal CLK2+) rises to an amplitude more positive than the respective negative differential input (e.g., the signal CLK1− or the signal CLK2−). However, the choice of a positive (rising) edge as indicative of arrival is arbitrary. A negative (falling) edge to indicate arrival may be implemented accordingly to meet the design criteria of a particular application.

The circuit 100 may comprise a circuit 110 and a circuit 112. The circuit 110 may be implemented as an input circuit. The circuit 112 may be implemented as a detector circuit. The signals CLK1 and CLK2 may be presented to inputs of the circuit 110. The circuit 110 may have a first output that may present an intermediate signal (e.g., A1) and a second output that may present another intermediate signal (e.g., A2). The circuit 110 may be configured to generate the signal A1 in response to the signal CLK1+ rising to a more positive potential than the signal CLK1−. The signal A2 may be generated in response to the signal CLK2+ rising to a more positive potential than the signal CLK2−. Alternatively, the circuit 110 may be configured to generate the signals A1 and A2 in response to the signals CLK1+ and CLK2+ falling to a more negative potential than the signals CLK1− and CLK2−, respectively. The signals A1 and A2 may be presented to inputs of the circuit 112. The circuit 112 may be configured to generate the signals CLK1LEAD and CLK2LEAD in response to the signals A1 and A2.

Figure 2:
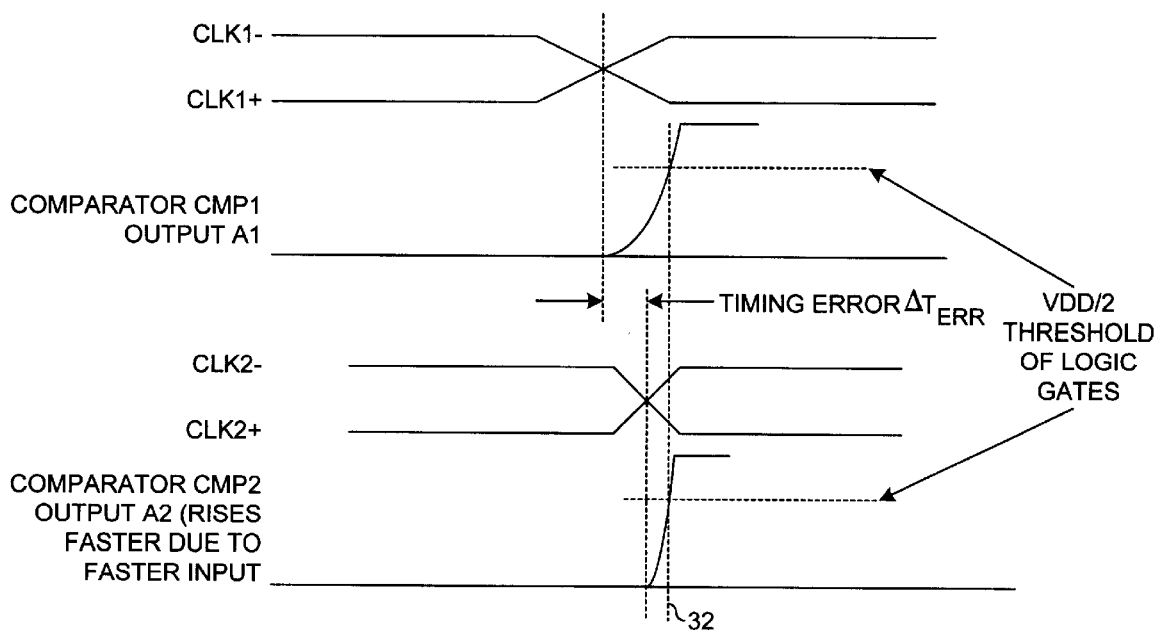
FIG. 2 is a timing diagram illustrating various signals of the circuit of FIG. 1.
Figure 4:
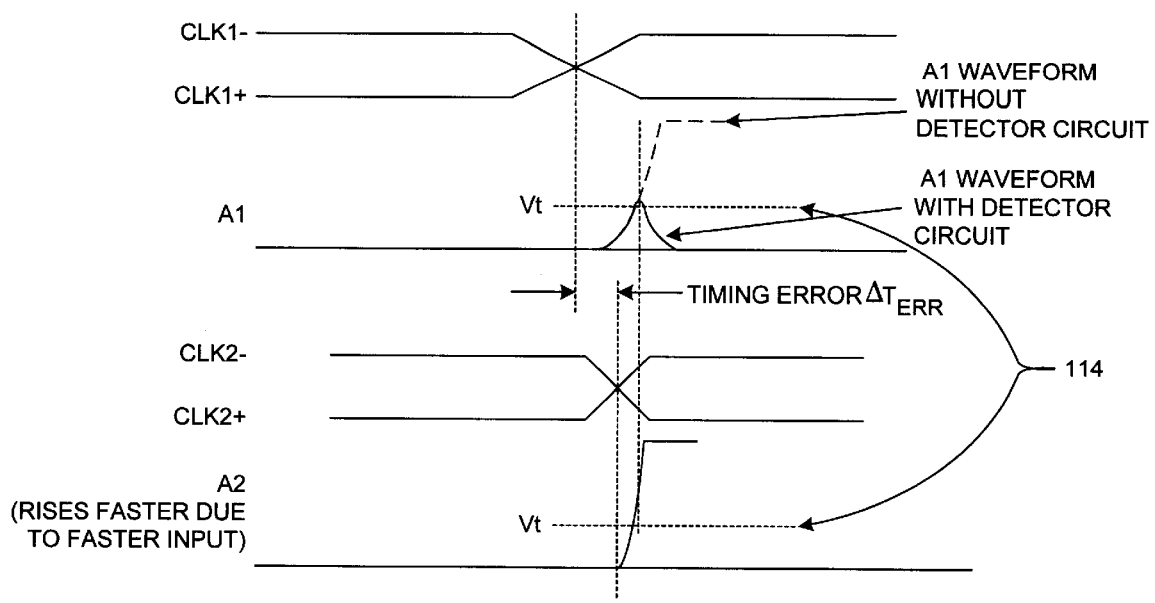
FIG. 4 is a timing diagram of an example operation of the circuit of FIG. 3.

Referring to FIG. 4, a timing diagram illustrating various example signals of FIG. 3 is shown. Using the CLK1 and CLK2 waveforms of FIG. 2, the circuit 100 may detect which of the signals CLK1 and CLK2 arrives first at a lower voltage level than the circuit 10 (e.g., the threshold 114). The threshold 114 may be implemented as a transistor threshold Vt. The time difference ΔTERR between the waveforms CLK1 and CLK2 is generally reduced when detection occurs at the lower voltage. In one example, reduction in the timing error by 50% may be obtained with the present invention relative to the previous solutions.

Figure 5:
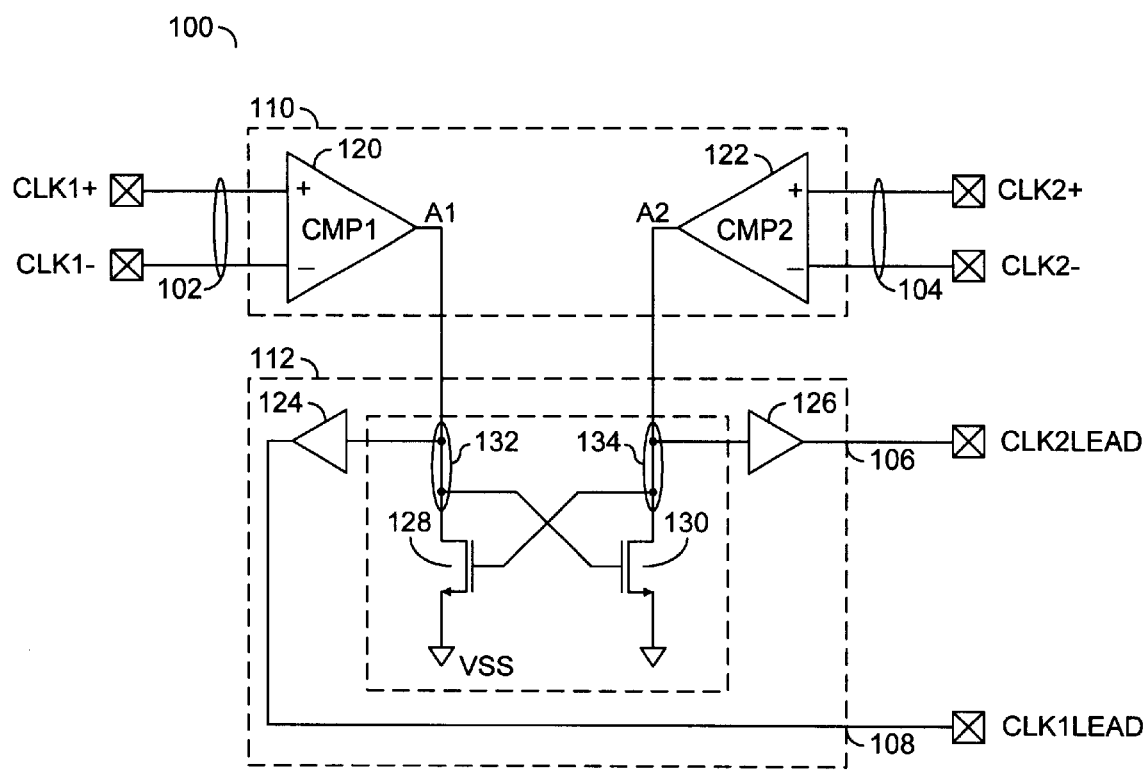
FIG. 5 is a more detailed block diagram of a preferred embodiment of the present invention.

Referring to FIG. 5, a more detailed block diagram of the circuit 100 in accordance with a preferred embodiment of the present invention is shown. The circuit 110 may comprise a comparator 120 and a comparator 122. The comparators 120 and 122 may be implemented, in one example, as amplifiers. In a preferred embodiment, the comparators 120 and 122 may be implemented as folded cascode transconductance amplifiers. Alternatively, the comparators 120 and 122 may be implemented as simple differential pair amplifiers. However, other types of amplifiers may :be implemented accordingly to meet the design criteria of a particular application. The comparator 120 may be configured to generate the signal A1 in response to the signal CLK1. The comparator 122 may be configured to generate the signal A2 in response to the signal CLK2.

The circuit 112 may comprise a gate 124, a gate 126, a transistor 128 and a transistor 130. The gates 124 and 126 may be implemented, in one example, as non-inverting CMOS buffers (drivers). However, other types of gates (or circuits) may be implemented accordingly to meet the design criteria of a particular application. The transistors 128 and 130 may be implemented, in one example, as metal oxide semiconductor (MOS) transistors. In one example, the transistors 128 and 130 may be implemented as NMOS transistors. In an alternative embodiment, the transistors 128 and 130 may be implemented as PMOS transistors. However, other types and polarities of transistors may be implemented accordingly to meet the design criteria of a particular application. For example, in an alternative embodiment the transistors 128 and 130 may be implemented as bipolar junction transistors.

The signal A1 may be presented to a node 132 formed by connection of an input of the gate 124, a source of the transistor 128 and a gate of the transistor 130. The signal A2 may be presented to a node 134 formed by connection of an input of the gate 126, a drain of the transistor 130 and a gate of the transistor 128. A source of the transistors 128 and 130 may be connected to a voltage supply ground (e.g., VSS). An output of the gate 124 may present the signal CLK1LEAD. An output of the gate 126 may present the signal CLK2LEAD. The nodes 132 and 134 may be configured to minimize parasitic capacitance.

When the signal CLK1 or the signal CLK2 at the inputs of the comparators 120 and 122 crosses zero differentially, the signal A1 or A2, respectively, generally starts rising. When the rising signal reaches a threshold voltage (e.g., Vt) of the respective transistor 128 or 130, the respective transistor 128 or 130 turns "ON" and generally prevents the other signal from rising (e.g., by clamping the other signal, in one example, to the voltage supply ground potential VSS). For example, when the signal A2 rises to the threshold voltage Vt before the signal A1, the transistor 128 will generally switch ON. When the transistor 128 is switched ON, the transistor 128 generally prevents the signal A1 from rising further by clamping the signal A1 to a reference voltage (e.g., VSS). Referring back to FIG. 4, after both of the signals CLK1 and CLK2 are finished rising, the signal A2 will generally be HIGH, while the signal A1 will generally be suppressed and held near zero (e.g., LOW).

When the signal A1 rises to Vt before the signal A2, the response of the transistors 128 and 130 may be similar but complementary. The transistor 130 will generally switch ON. When the transistor 130 is switched ON, the transistor 130 generally prevents the signal A2 from rising further by clamping the signal A2 to the reference voltage VSS. After both of the signals CLK1 and CLK2 are finished rising, the signal A1 will generally be HIGH, while the signal A2 will generally be suppressed and held near zero (e.g., LOW).

The transistors 128 and 130 are generally sized to sink (or source) a greater current than the outputs of the comparators 120 and 122 can source (or sink). Sizing the transistors 128 and 130 to sink (or source) a greater current than the comparators can source (or sink) generally ensures that one output (e.g., CLK1LEAD or CLK2LEAD) transitions HIGH while the other output (e.g., CLK2LEAD or CLK1LEAD) remains LOW.

The HIGH state of the signal A2 may be converted by the gate 126 to an output logic level. The delay through the gates 124 and 126 does not generally affect the accuracy of the decision made by the transistors 128 and 130. The output of the gates 124 and 126 may be sampled at a convenient time to determine which signal arrived first. For example, when the signal A1 arrives first, the node 130 will generally be HIGH. In general, a single output path may be sampled. However, both output paths are generally implemented to maintain symmetry.

The present invention may provide a performance enhancement over previous detectors because a small rise in voltage of the signals A1 and A2 (e.g., the threshold voltage Vt of the transistors 128 and 130) is used to make the decision of which signal arrives first. Since the voltage at which the decision is made is small, the time to reach the voltage is small, as is the difference in the times between the two signals. The time error difference produced by different input conditions may thus be reduced.

In addition, the present invention may simplify the decision logic to two transistors. Replacing the logic gates (as shown in FIG. 1) with two transistors generally reduces the load capacitance seen at the output of the comparators 120 and 122. The present invention may implement a hybrid amplifier/decision logic circuit that generally merges the function of the cross-coupled gates with the input amplifiers. For example, the amplifiers may provide a pull-up function previously provided by PMOS transistors in the conventional logic gates.

The speed of the output buffers (gates) 124 and 126 is generally not critical. The buffers 124 and 126 may be implemented with minimum sized input stages. The single MOS transistors 128 and 130 generally present a small load so the rise time of: the comparator outputs may be very close to the maximum speed of a particular process (technology). However, the rise time of the comparator outputs may be limited by self-loading of a diffusion capacitance of the amplifier output transistors.

The comparators 120 and 122 may be implemented in a number of ways. In one example, each of the comparators 120 and 122 may be implemented as a folded cascode transconductance amplifier. Implementing the comparators as folded cascade amplifiers may maximize the common mode range of the comparator inputs. Alternatively, each of the comparators 120 and 122 may be implemented as a differential pair amplifier. When the comparators 120 and 122 are implemented as differential pair amplifiers, the transistors 128 and 130 may be implemented as part of a differential load of the differential pairs.

Figure 6:
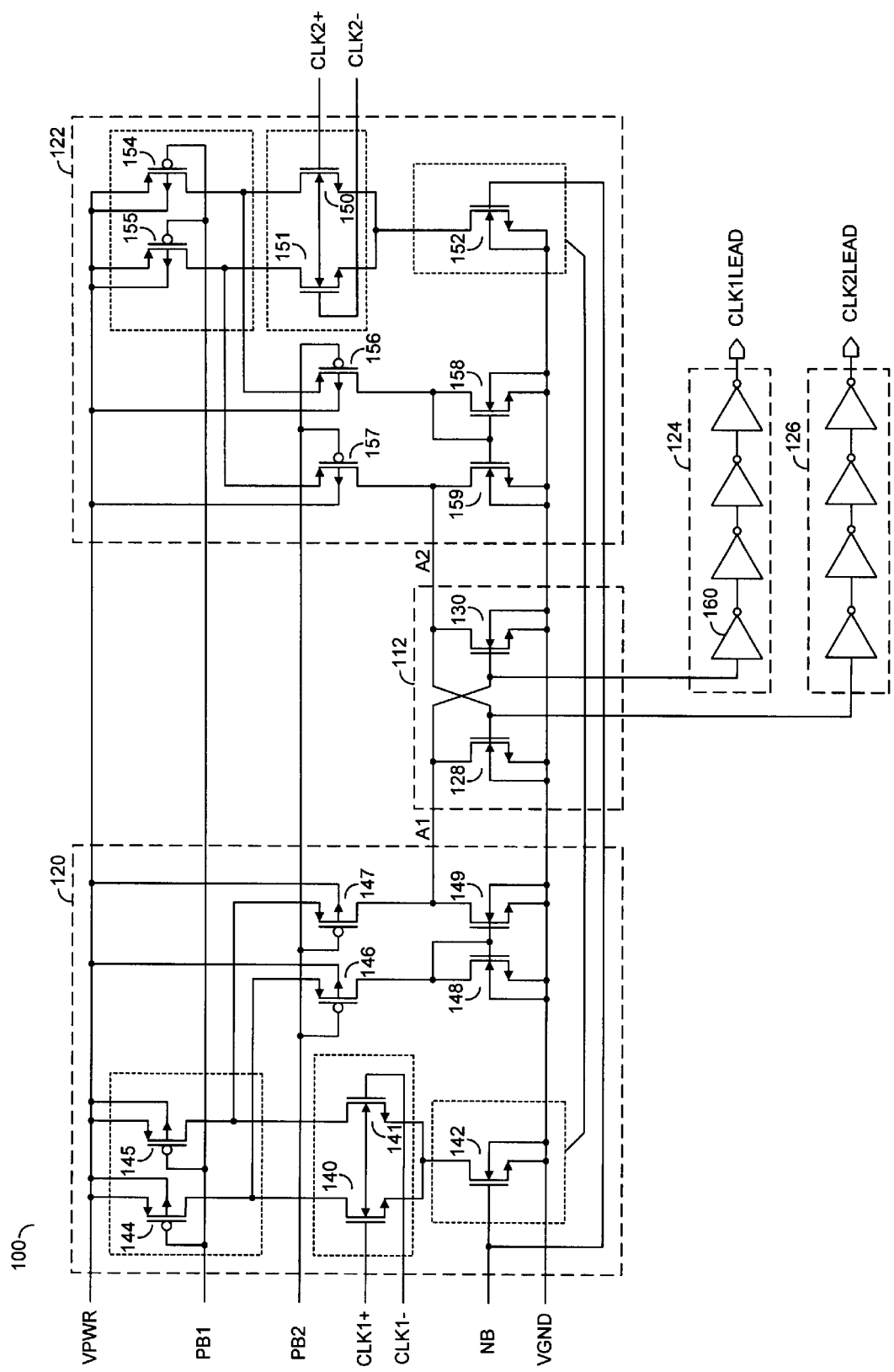
FIG. 6 is a schematic diagram illustrating a preferred embodiment of the present invention.

Referring to FIG. 6, a schematic diagram of a preferred embodiment of the present invention is shown. Each of the input comparators 120 and 122 may be implemented as a folded cascode amplifier. The circuit 120 may comprise a number of transistors 140–149. The circuit 122 may comprise a number of transistors 150–159. The transistors 128, 130, 140, 141, 142, 148, 149, 150, 151, 152, 158, and 159 may be implemented, in one example, as NMOS transistors. The transistors 145, 146, 147, 154, 155, 156 and 157 may be implemented, in one example, as PMOS transistors. Alternatively, the transistors 128, 130, and 140–159 may be implemented accordingly with complementary polarities. The transistors 140, 141 and 142 may be configured as a differential common source amplifier stage. The transistors 146, 147, 148 and 149 may be configured as a differential common gate amplifier stage. Similarly, the transistors 150, 151 and 152 may be configured as a differential common source amplifier stage and the transistors 156, 157, 158 and 159 may be configured as a differential common gate amplifier stage.

The signal CLK1+ may be presented to a gate of the transistor 140. The signal CLK1− may be presented to a gate of the transistor 141. A source of the transistors 140 and 141 may be connected together with a drain of the transistor 142. A gate of the transistor 142 may receive a bias voltage (e.g., NB). A source of the transistor 142 may be connected to a power supply ground (e.g., VGND) A drain of the transistor 140 may be connected to a drain of the transistor 144. A drain of the transistor 141 may be connected to a drain of the transistor 145. A gate of the transistors 144 and 145 may receive a bias voltage (e.g., PB1). A source of the transistors 144 and 145 may be connected to a power supply voltage (e.g., VPWR).

The drain of the transistor 140 may be connected to a source of the transistor 146. The drain of the transistor 141 may be connected to a source of the transistor 147. A gate of the transistors 146 and 147 may receive a bias voltage (e.g., PB2). A drain of the transistor 146 may be connected to a drain and a gate of the transistor 148 and a gate of the transistor 149. A drain of the transistor 147 may be connected to a drain of the transistor 149. A source of the transistors 148 and 149 may be connected to the power supply ground potential VGND. The signal A1 may be presented at a node formed by the connection of the drains of the transistors 147 and 149. Wells of the NMOS transistors are generally connected to the power supply ground VGND. Wells of the PMOS transistors are generally connected to the power supply voltage VPWR.

The circuit 122 may be implemented similarly to the circuit 120. The signal CLK2+ may be presented to a gate of the transistor 150. The signal CLK2− may be presented to a gate of the transistor 151. A source of the transistors 150 and 151 may be connected together with a drain of the transistor 152. A gate of the transistor 152 may receive the bias voltage NB. A source of the transistor 152 may be connected to the power supply ground VGND. A drain of the transistor 150 may be connected to a drain of the transistor 154. A drain of the transistor 151 may be connected to a drain of the transistor 155. A gate of the transistors 154 and 155 may receive the bias voltage PB1. A source of the transistors 154 and 155 may be connected to the power supply voltage VPWR.

The drain of the transistor 150 may be connected to a source of the transistor 156. The drain of the transistor 151 may be connected to a source of the transistor 157. A gate of the transistors 156 and 157 may receive the bias voltage PB2. A drain of the transistor 156 may be connected to a drain and a gate of the transistor 158 and a gate of the transistor 159. A drain of the transistor 157 may be connected to a drain of the transistor 159. A source of the transistors 158 and 159 may be connected to the power supply ground VGND. The signal A2 may be presented at a node formed by the connection of the drains of the transistors 157 and 159. The wells of the NMOS transistors are generally connected to the power supply ground VGND. The wells of the PMOS transistors are generally connected to the power supply potential VPWR.

Well known common centroid lay out techniques may be employed to reject gradients. For example, the transistors 140 and 141 may be implemented with a common centroid. The transistors 144 and 145 may be implemented with a common centroid. The transistors 150 and 151 may be implemented with a common centroid. The transistors 154 and 155 may be implemented with a common centroid. The transistors 142 and 152 may be implemented with a common centroid.

In one example, the signals CLK1 and CLK2 may be coupled to the comparators 120 and 122 via electrostatic discharge (ESD) protection circuits (not shown). The buffers 124 and 126 may be implemented, in one example, as a number of inverters 160 (e.g., 4) connected serially. The bias signals PB1, PB2 and NB may be generated with conventional bias circuits (not shown) implemented in accordance with standard design practices. For example, the bias voltages PB1, PB2 and NB are generally derived from a current reference such as a band-gap, a VT (threshold voltage) reference, or the supply voltage VPWR and a resistor or transistor.

Generally, bias currents are converted to bias voltages by passing the bias currents through diode connected transistors that are generally implemented similarly to but scaled smaller in size relative to the transistors that are being biased. For example, static currents in the transistors 144, 145, 155, and 154 are generally greater than the current in the transistors 142 and 152. When the differential pairs (e.g., the transistors 140 and 141 and/or the transistors 150 and 151) are fully switched, the greater static currents in the transistors 144, 145, 154 and 155 generally ensure that current continues to flow into the sources of the transistors 146, 147, 156 and 157.

Maintaining current flow into the transistors 146, 147, 156 and 157 generally prevents the voltage at the sources of the transistors 146, 147, 156, and 157 from falling towards the ground potential VGND between transitions of the signals CLK1 and CLK2. By minimizing the voltage swing at the sources of the transistors 146, 147, 156 and 157, the switching speed of the circuit 100 is generally maximized.

Figure 7A:
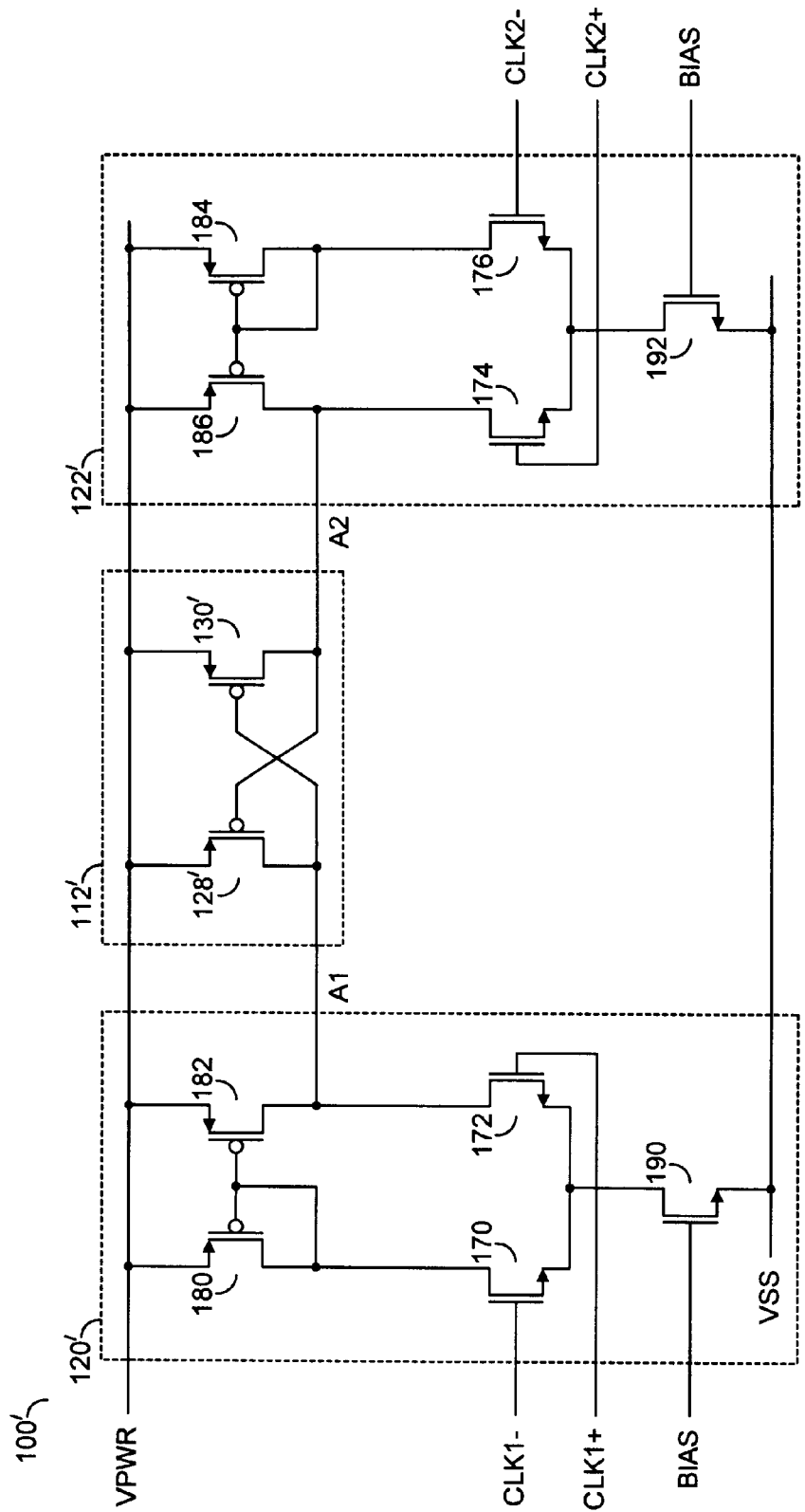
FIGS. 7(a–b) are schematic diagrams of alternate embodiments of the present invention.
Figure 7B:
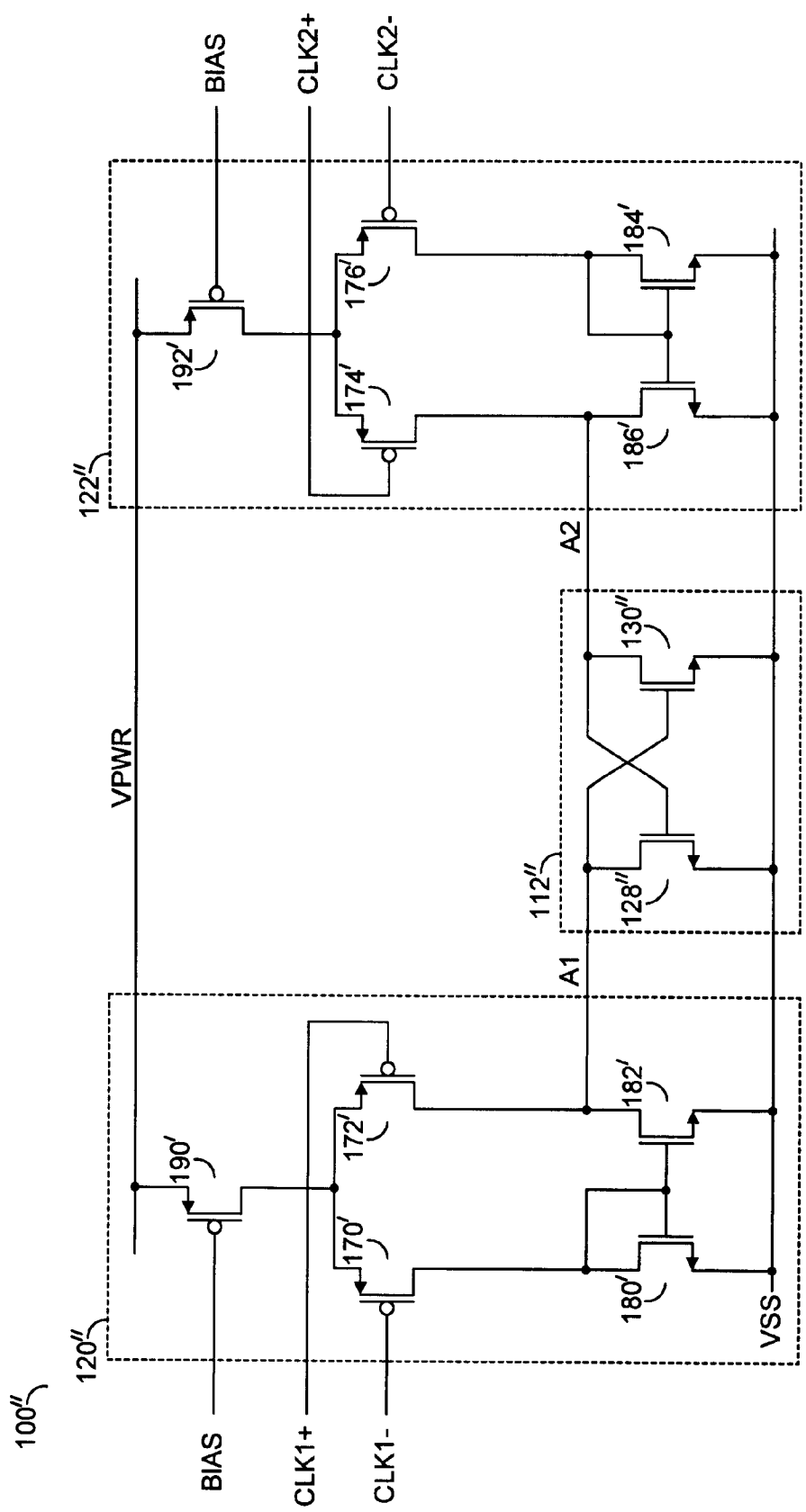

Referring to FIGS. 7 (a–b), schematic diagrams of circuits 100' and 100" illustrating an alternate embodiment of the present invention are shown. The input comparators 120 and 122 may be implemented as differential pair input amplifiers 120' and 122' (FIG. 7a) or 120" and 122" (FIG. 7b). The input comparators 120' and 122' generally comprise differential input transistors 170, 172, 174, and 176 that are generally implemented with complementary transistor types to the transistors 128' and 130'. For example, the input transistors 170, 172, 174, and 176 may be implemented with NMOS transistors and the transistors 128' and 130' may be implemented in PMOS.

The differential input amplifiers 120' and 122' generally comprise differential load transistors 180, 182, 184, and 186 that are generally implemented with transistor types similar to the transistors 128' and 130'. The differential input amplifiers 120' and 122' may be biased with a bias signal (e.g., BIAS) presented, to a gate of a transistor 190 and a transistor 192, respectively. The bias signal BIAS may be generated with a bias circuit as described above in connection with FIG. 6. The buffers 124 and 126 have been omitted for clarity.

Referring to FIG. 7b, the input comparators 120" and 122" are generally implemented similarly to the differential input amplifiers 120' and 122'. However, the input transistors 170', 172', 174', and 176' may be implemented with PMOS transistors and the transistors 128" and 130" may be implemented in NMOS. The differential load transistors 180', 182', 184', and 186' are generally implemented in NMOS. Other input amplifier configurations may be implemented, for example, to provide rail-to-rail input operation.

Figure 8:
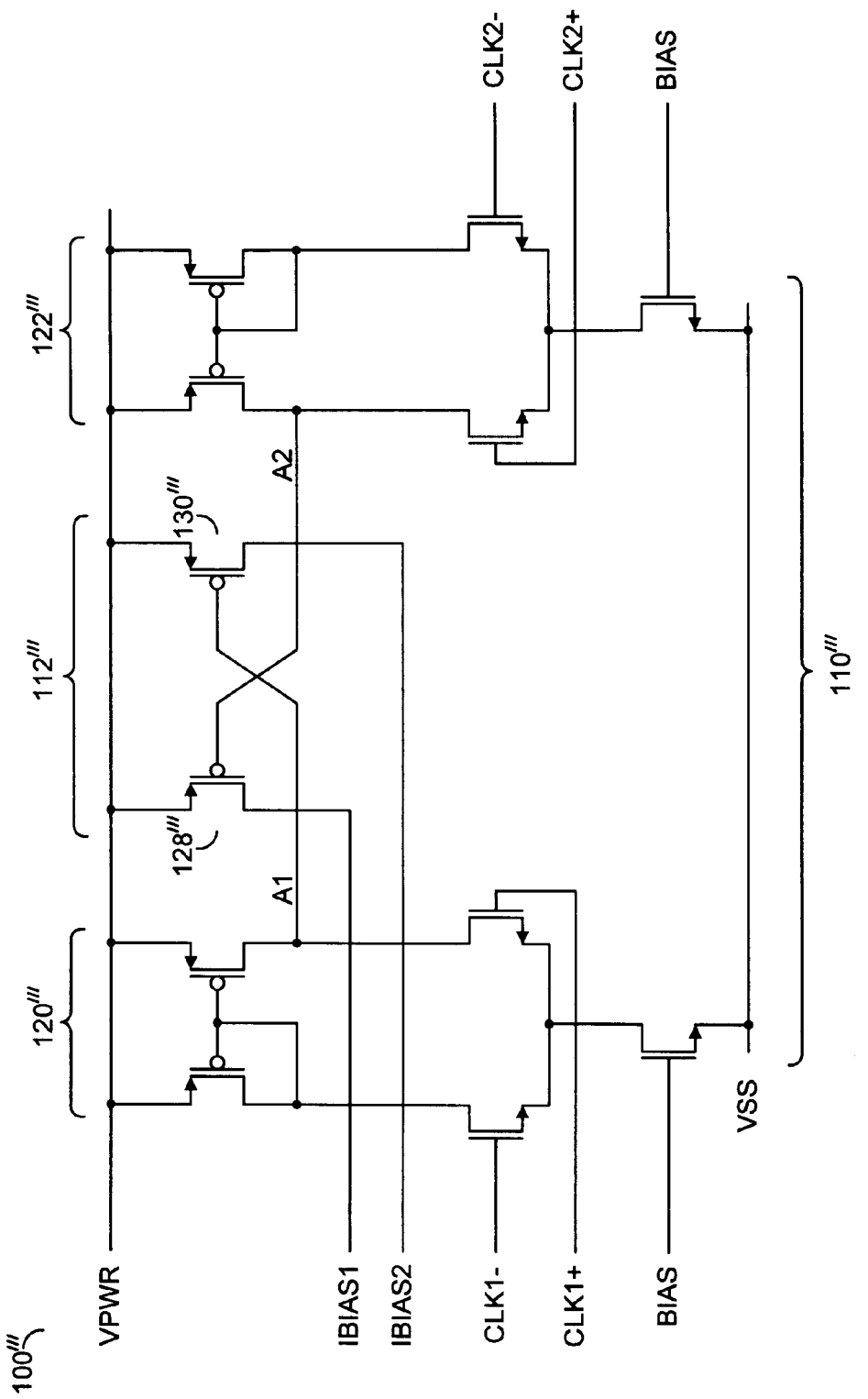
FIG. 8 is a schematic diagram of another alternative embodiment of the present invention.

Referring to FIG. 8, a schematic diagram of a circuit 100'" illustrating another alternate embodiment of the present invention is shown. The circuit 100'" may be implemented similarly to the circuit 100' of FIG. 7a. Additional enhancement may be made to further reduce the voltage change that turns ON the transistors 128'" and 130'". For example, a bias current (e.g., IBIAS1 and IBIAS2) may be injected into the nodes A1 and A2, respectively, to generally set the "OFF" voltage of the nodes at a voltage level that is closer to the threshold voltage (e.g., Vt) of the transistors 128'" and 130'" than to the power rail. The transistors 128'" and 130'" are generally configured to avoid "latching" until the input voltage of the differential pairs has crossed zero volts. The buffers 124 and 126 have been omitted for clarity.

The present invention may also be implemented in bi-polar or technologies other than CMOS. Bi-polar transistors may have much smaller switching voltages (e.g., better DC gain) than CMOS transistors and may inherently provide better comparator circuits for time discrimination. However a bi-polar design may also be improved by application of the present invention.

Example applications where the circuit 100 may be implemented may be found in the co-pending patent application U.S. Ser. No. 09/846,146, which is hereby incorporated by reference in its entirety. Generally, information on which signal is leading is processed with digital circuitry. For example, an output of the digital circuitry may provide a signal correction or adjustment of a delay in the signal path or the phase of an oscillator to complete a negative feedback loop. The correction generally proceeds (is repeated) until the output of the phase detector randomly varies between a "lead" state (e.g., 0) and a "lag" state (e.g., 1) with 50% of the time in the "lead" state and 50% of the time in the "lag" state. The terms "lead" and "lag" generally refer to one input arriving ahead of or behind the other input.

The present invention may provide increased accuracy over existing techniques. In general, the delays through a circuit will vary with input amplitude and rise time of the input signal. Typically, delays increase with decreasing amplitude and increasing rise time. Thus, when two signals have different amplitudes and/or rise times, there will generally be a mismatch between the apparent time of crossing seen at the output of the amplifiers and the signals actual crossing time.

The present invention generally reduces the problems associated with existing techniques by decreasing the voltage at which a decision is made concerning arrival of a signal. For the same amplifier outputs, when a decision about the relative arrival time of two signals is made at a lower voltage, the time divergence between the two signals is reduced. In addition, the present invention generally implements two cross-coupled transistors as the decision circuit. The cross-coupled transistors generally reduce the capacitance that the amplifier stages drive, further increasing the accuracy of the circuit.

The present invention may accurately detect which of two signals arrives first; minimize the timing error in detecting which signal arrives first when the two signals have different rise times and/or amplitudes; minimize the timing error in detecting which signal arrives first by minimizing the voltage swing required at the output of an input amplifier; be implemented as a pair of cross-couple transistors merged with a differential amplifier; replace the functionality of a pair of cross-coupled logic gates to make the decision of which signal is arriving first at a very small voltage change; and/or present a minimum load to maximize the speed of the input comparators.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate (i) a first intermediate signal in response to a first differential signal and (ii) a second intermediate signal in response to a second differential signal; and
    a second circuit configured (i) to generate one or more output signals in response to a relative arrival time of said first and second intermediate signals and (ii) to clamp a later arriving one of said first and second intermediate signals to a predefined voltage level.

2. The apparatus according to claim 1, wherein said first circuit comprises a first comparator and a second comparator.

3. The apparatus according to claim 2, wherein each of said comparators comprises an amplifier circuit.

4. The apparatus according to claim 3, wherein said amplifier circuit comprises a folded cascode transconductance amplifier.

5. The apparatus according to claim 1, wherein said second circuit comprises a pair of cross-coupled transistors.

6. The apparatus according to claim 5, wherein said cross-coupled transistors comprise NMOS transistors.

7. The apparatus according to claim 5, wherein said cross-coupled transistors comprise PMOS transistors.

8. The apparatus according to claim 5, wherein:
    a first transistor of said pair of cross-coupled transistors has a first terminal connected to said predefined voltage level, a second terminal configured to receive said first intermediate signal, and a second terminal configured to receive said second intermediate signal; and
    a second transistor of said pair of cross-coupled transistors is configured to receive said second intermediate signal at a first terminal, said first intermediate signal at a second terminal and said predefined voltage level at a third terminal.

9. The apparatus according to claim 3, wherein said amplifier circuit comprises a differential pair of transistors.

10. The apparatus according to claim 1, wherein said arrival of said first and second intermediate signals is detected at a transistor threshold voltage.

11. The apparatus according to claim 1, wherein said predefined voltage level comprises a power supply ground potential.

12. The apparatus according to claim 5, wherein said second circuit further comprises a plurality of buffers configured to generate said one or more output signals.

13. The apparatus according to claim 5, wherein said cross-coupled transistors are sized to source/sink a greater current than said first circuit sinks/sources.

14. An apparatus comprising:
    means for generating (i) a first intermediate signal in response to a first differential signal and (ii) a second intermediate signal in response to a second differential signal; and
    means for generating one or more output signals in response to a relative arrival time of said first and second intermediate signals and clamping a later arriving one of said intermediate signals to a predefined voltage level.

15. A method for generating an output signal indicative of which of two differential signals arrives first comprising the steps of:
    generating a first intermediate signal in response to a first differential signal;
    generating a second intermediate signal in response to a second differential signal;
    generating one or more output signals in response to a relative arrival time of said first and second intermediate signals; and clamping a later arriving one of said first and second intermediate signals to a predefined voltage level.

16. The method according to claim 15, wherein said first and second intermediate signal generating steps comprise the step of amplifying said first and second differential signals.

17. The method according to claim 15, wherein said output signal generating step further comprises the step of:

detecting said first and second intermediate signals rising to a transistor threshold voltage.

18. The method according to claim 15, wherein said clamping step comprises the step of:

clamping said later arriving one of said first and second intermediate signals to said predefined voltage level in response to the other intermediate signal rising to a transistor threshold voltage.

19. The method according to claim 15, wherein said predefined voltage level comprises a power supply ground potential.

20. The method according to claim 15, further comprising the step of injecting a bias current into a first node and a second node configured to receive said first intermediate signal and said second intermediate signal, respectively.

\* \* \* \* \*